US006828002B2

United States Patent
Chou et al.

(10) Patent No.: US 6,828,002 B2
(45) Date of Patent: Dec. 7, 2004

(54) SUBSTRATE STRIP WITH SIDES HAVING FLANGES AND RECESSES

(75) Inventors: Kuang-Chun Chou, Kaoshiung (TW); Win-Chi Cheng, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/268,478

(22) Filed: Oct. 10, 2002

(65) Prior Publication Data

US 2003/0072913 A1 Apr. 17, 2003

(30) Foreign Application Priority Data

Oct. 12, 2001 (TW) ........................................ 90125235 A

(51) Int. Cl.$^7$ ............................ B32B 3/02; H01L 23/02; H01L 23/28
(52) U.S. Cl. ......................... 428/81; 428/131; 257/685; 257/782; 257/787; 257/666; 257/670; 257/712; 257/722; 257/730; 438/110
(58) Field of Search ................................. 257/685, 782, 257/787, 666, 670, 712, 722, 730; 430/110; 428/81, 131

(56) References Cited

U.S. PATENT DOCUMENTS 5,886,398 A * 3/1999 Low et al. ................... 257/667
6,013,947 A * 1/2000 Lim ........................... 257/685

\* cited by examiner

Primary Examiner—William P. Watkins, III
Assistant Examiner—Patricia L. Nordmeyer
(74) Attorney, Agent, or Firm—Seyfarth Shaw LLP

(57) ABSTRACT

The present invention relates to a substrate strip with sides having flanges and recesses. The substrate strip is obtained by cutting a panel where a plurality of substrate strips can be arrayed. The substrate strip comprises a first side and a second side. The first side comprises a plurality of first flanges and a plurality of first recesses defined between the first flanges. The second side comprises a plurality of second flanges and a plurality of second recesses defined between the second flanges. The complementary shapes of the first side and the second side are suitable for arraying the two substrate strips most closely, and the most substrate strips can be cut from the panel. Accordingly, waste of the panel can be avoided. The cost of the panel is enormously slashed and the total cost of manufacture is reduced thereby.

6 Claims, 6 Drawing Sheets

SUBSTRATE STRIP WITH SIDES HAVING FLANGES AND RECESSES

BACKGROUND OF THE INVENTION

1. Field of the Invention

The present invention relates to a substrate strip, particularly to a substrate strip with sides having flanges and recesses.

2. Description of the Related Art

Referring to FIG. 1, a conventional substrate strip 1 comprises five die pads 11, 12 for supporting dice (not shown) to be packaged and five mold gates 13, 14 extending from an edge of the substrate strip 1 to each of the die pads 11, 12 for guiding mold compound into the die pads 11, 12. A first frame 15 is defined between the die pad 11 and the die pad 12. A second frame 16 is formed at a lower lateral side of the die pad 11. A third frame 17 is formed at an upper lateral side of the die pad 11 and near the mold gate 13. The first frame 15, the second frame 16, and the third frame 17 are for positioning and delivering the substrate strip 1.

Referring to FIG. 2, the substrate strip 1 is obtained by cutting a panel 2. A plurality of substrate strips 1 can be arrayed on the panel 2 and then cut therefrom. Only some fixed sizes are for the panel 2, and margins should be kept between the substrate strips arrayed, so that the conventional substrate strips cannot be arrayed most densely on the panel 2 to obtain the most substrate strips. Usually, part of the panel is wasted, for example, in a region shown with dotted lines in FIG. 2.

Therefore, it is necessary to provide an innovative and advanced substrate strip so as to solve the above problem.

SUMMARY OF THE INVENTION

One objective of the present invention is to provide a substrate strip with sides having flanges and recesses. The substrate strip is obtained by cutting a panel where a plurality of substrate strips can be arrayed. The substrate strip comprises a plurality of die pads, a first side, and a second side. The die pads are for supporting dice to be packaged. The first side comprises a plurality of first flanges and a plurality of first recesses defined between the first flanges. The second side comprises a plurality of second flanges and a plurality of second recesses defined between the second flanges. The second flanges are formed in the locations corresponding to the first recesses, and the second recesses are formed in locations corresponding to the first flanges. The complementary shapes of the first side and the second side are suitable for arraying the two substrate strips most closely, and the most substrate strips can be arrayed most densely. Accordingly, the most substrate strips can be cut from the panel, and waste of the panel can be avoided. The cost of the panel is enormously slashed and the total cost of manufacture is reduced thereby.

DETAILED DESCRIPTION OF THE INVENTION

Figure 3:
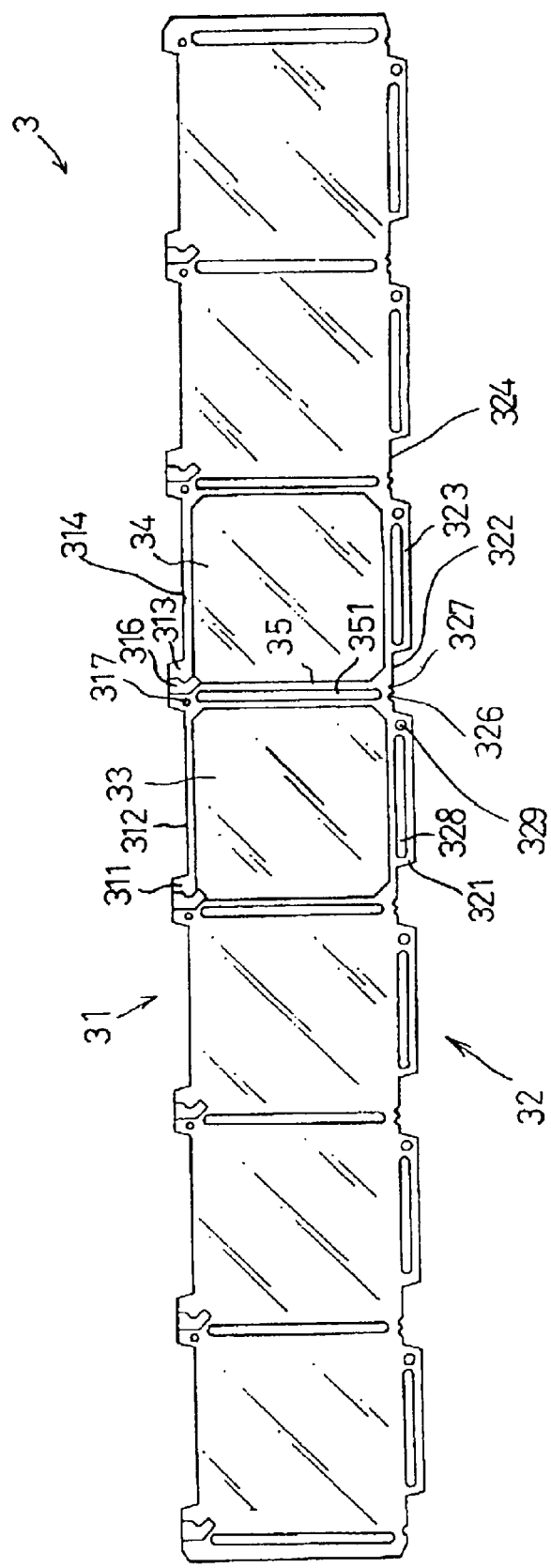
FIG. 3 shows the substrate strip according to the first embodiment of the invention.

Referring to FIG. 3, according to the first embodiment of the invention, a substrate strip 3 with sides having flanges and recesses comprises a first side 31, a second side 32, and a plurality of die pads 33, 34. The first side 31 and the second side 32 are at opposite sides of the substrate strip 3 and substantially parallel to each other. The die pads 33, 34 are for supporting dice (not shown) to be packaged, and the substrate strip 3 can be used for supporting seven dice. A first frame 35 defined between the die pads 33 and 34 comprises a first slot 351 through a top and a bottom of the substrate strip 3 for positioning.

The first side 31 comprises a plurality of first flanges 311, 313 and a plurality of first recesses 312, 314. Taking the first flange 313 as an example, the first flange 313 comprises a mold gate 316 and a first index hole 317, the mold gate 316 extending from an edge of the first flange 313 to the die pad 34 for guiding mold compound into the die pad 34 and the first index hole 317 through a top and a bottom of the substrate strip 3 for positioning.

Figure 1:
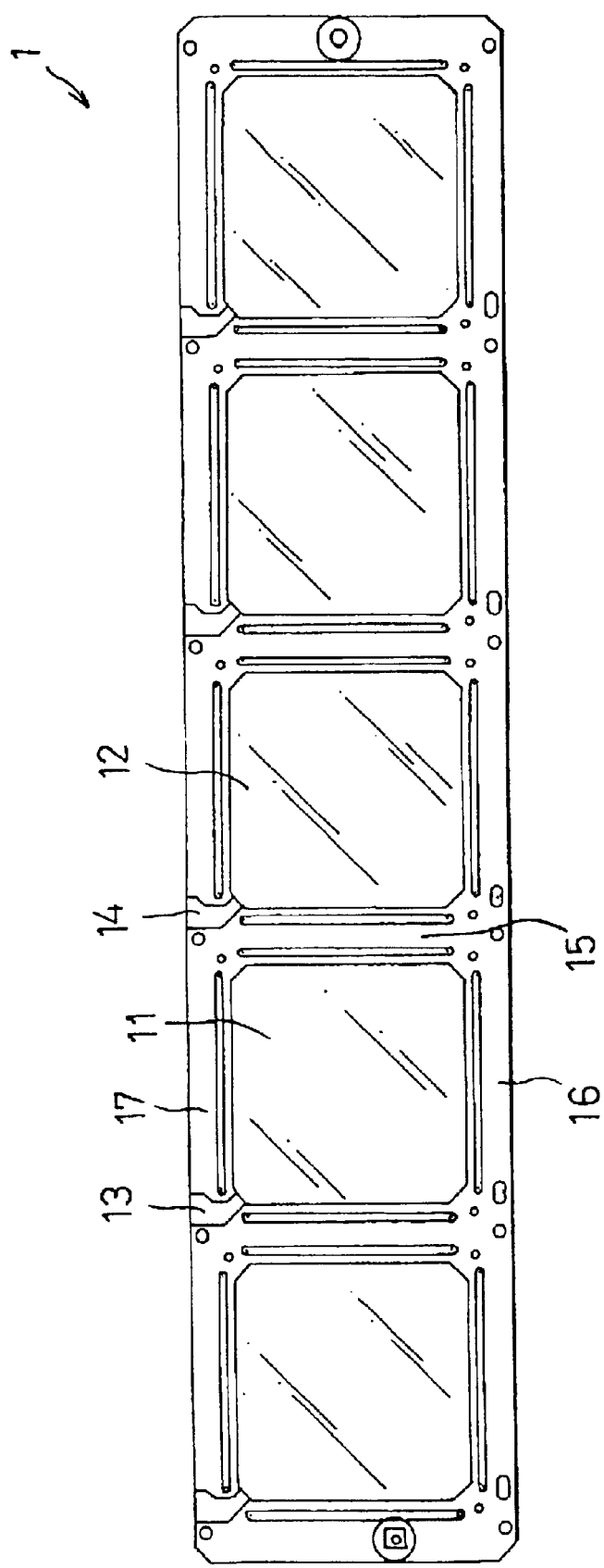
FIG. 1 shows the conventional substrate strip.
Figure 2:
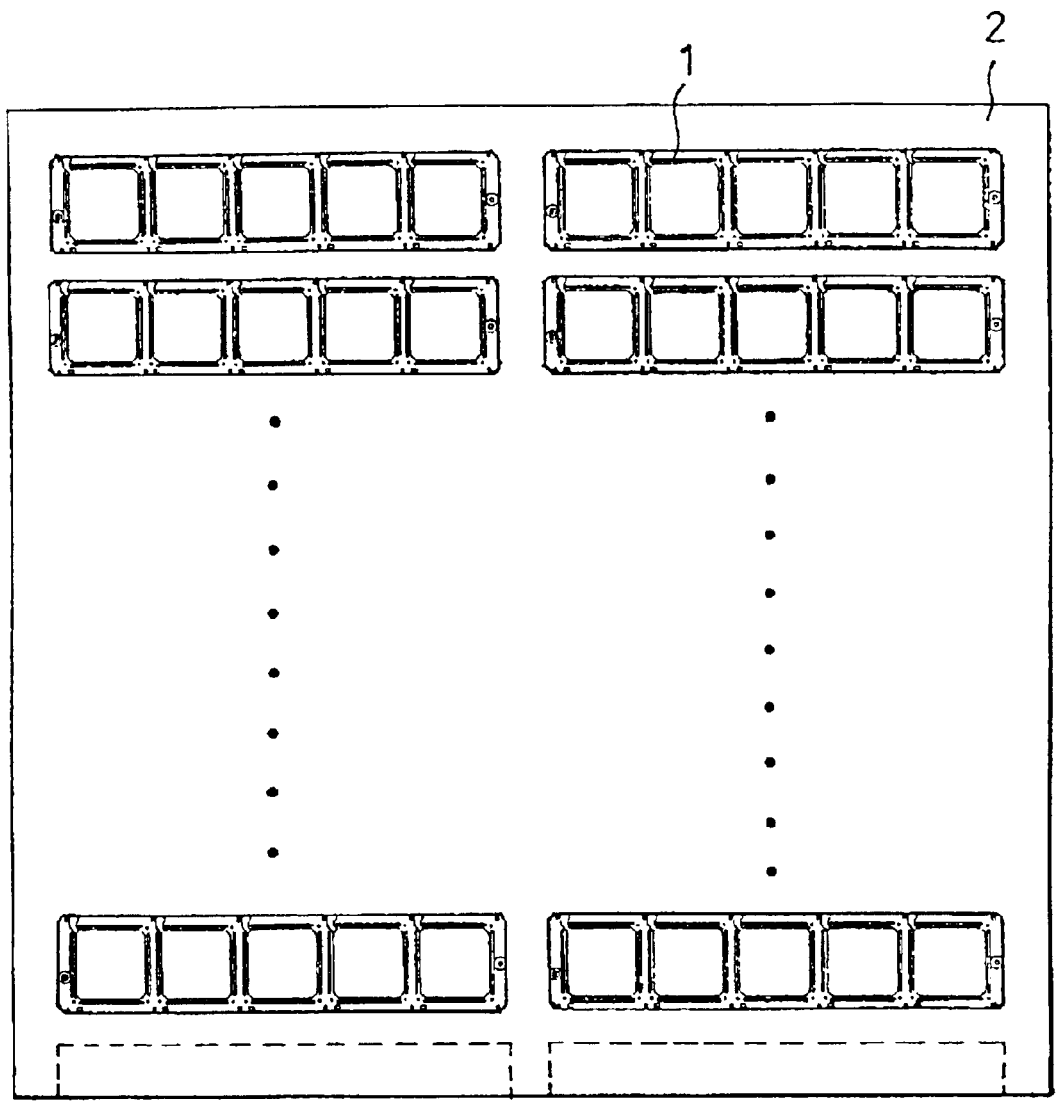
FIG. 2 shows the conventional substrate strips arrayed on a panel.

The two adjacent first flanges define each of the first recesses. Taking the first recess 312 as an example, the first recess 312 is formed between the first flanges 311 and 313. The location of the first recess 312 is corresponding to that of the third frame 17 of the conventional substrate strip 1 (shown in FIG. 1). The space of the conventional third frame 17 is retrenched in the invention, and the conventional third frame 17 is replaced by the first index hole 317, the first frame 35, or the combination thereof without changing the effects.

The second side 32 opposite to the first side 31 comprises a plurality of second flanges 321, 323 and a plurality of second recesses 322, 324. The two adjacent second flanges define each of the second recesses. Taking the second recess 322 as an example, the second recess 322 is formed between the second flanges 321 and 323. The second flange 321 is formed in the location corresponding to the first recess 312, and the second recess 322 is formed in the location corresponding to the first flange 313.

Figure 4:
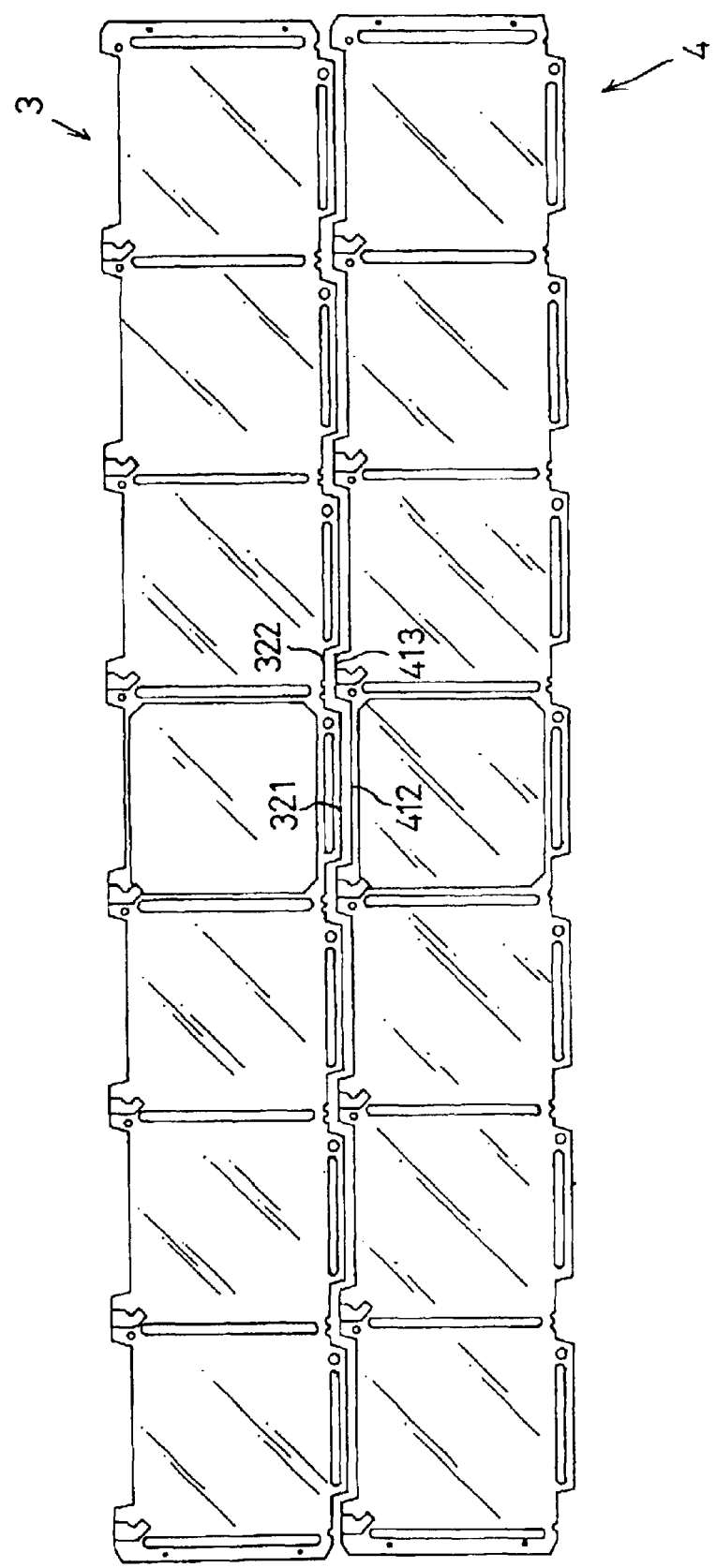
FIG. 4 shows the two substrate strips arrayed on a panel according to the first embodiment of the invention.

The size of the second flange 321 is smaller than that of the first recess 312, and the size of the second recess 322 is larger than that of the first flange 313, so that the second flange 321 of the second side 32 can be received in a first recess 412 of another substrate strip 4 (referring to FIG. 4), and the second recess 322 of the second side 32 can receive a first flange 413 of the another substrate strip 4 (referring to FIG. 4). The complementary shapes of the first side 31 and the second side 32 make the substrate strip be able to be arrayed on the panel most densely.

Figure 5:
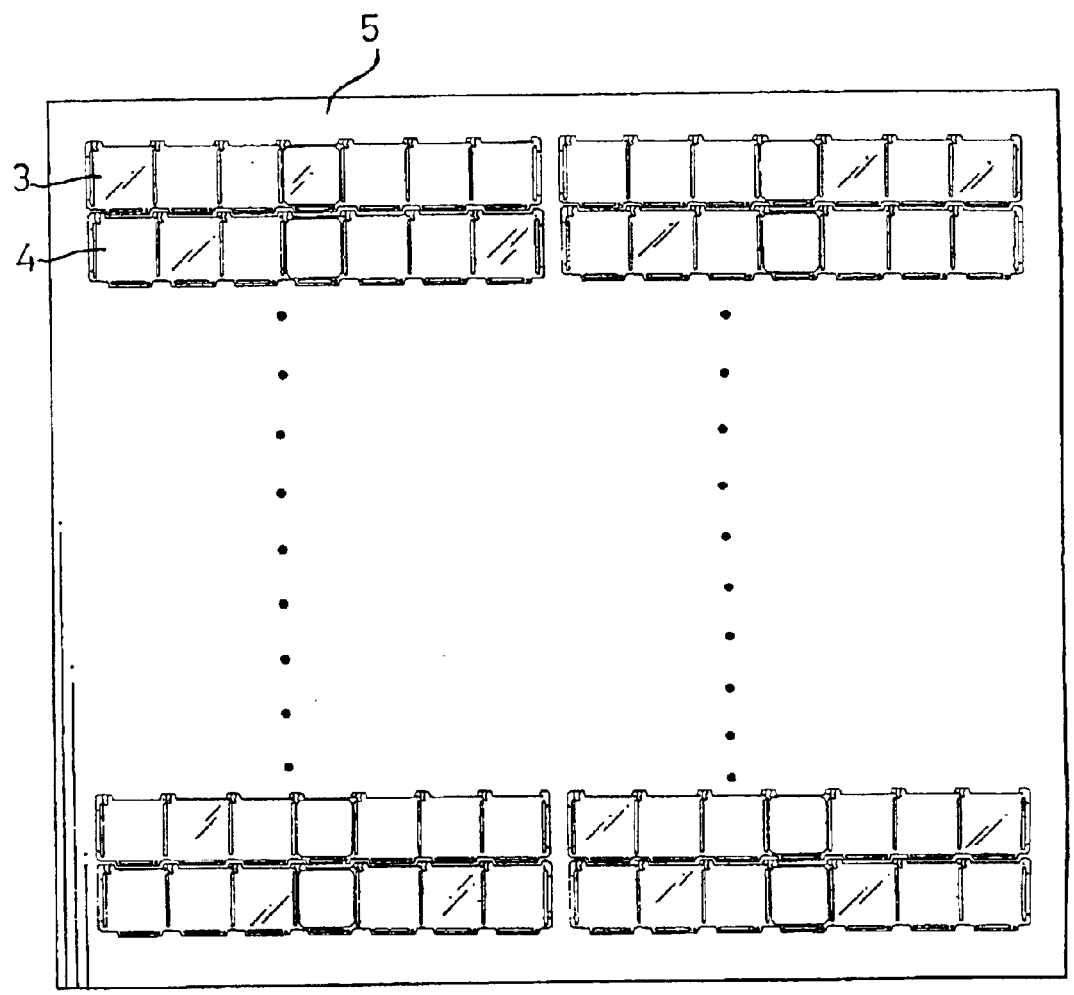
FIG. 5 shows the substrate strips arrayed on a panel according to the first embodiment of the invention.

Referring to FIG. 5, the substrate strips 3, 4 according to the invention can be arrayed on the panel 5 most densely. Accordingly, the most substrate strips can be cut from the panel 5, and the waste of panel can be avoided. The cost of the panel is slashed and the total cost of manufacture is reduced thereby.

Referring to FIG. 3, the second side 32 comprises a plurality of second index holes 326, 327 formed in the second recess 322. The second index holes 326, 327 through the top and the bottom of the substrate strip 3 have a semicircular cross-section. The second index hole 326 is formed in the location corresponding to the first index holes 317, and the second index hole 327 is formed near the second index hole 326. The second index holes 326, 327 are used for positioning.

The second flange 321 is formed at a lower lateral side of the die pad 33 as a second frame of the substrate strip 3. The second flange 321 comprises a second slot hole 328 and a second frame index hole 329 for location and delivering the substrate strip.

Figure 6:
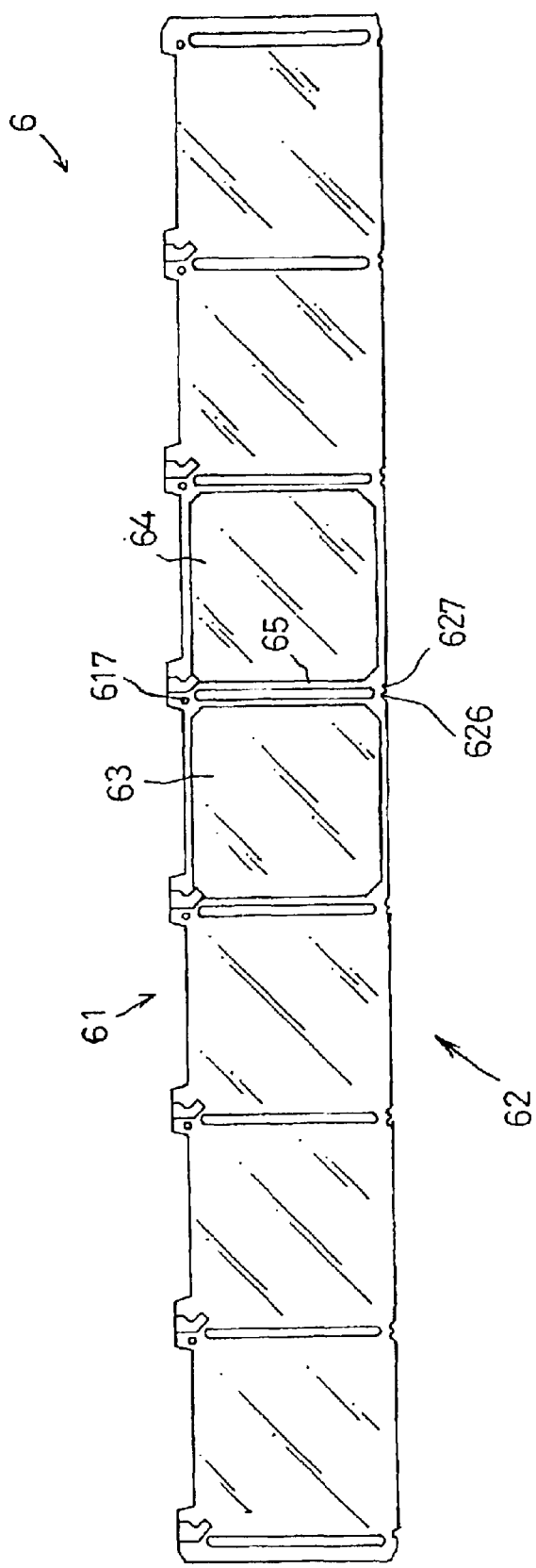
FIG. 6 shows the substrate strip according to the second embodiment of the invention.

Referring to FIG. 6, the substrate strip 6 with sides having flanges and recesses according to the second embodiment of the invention comprises a first side 61, a second site 62, and a plurality of die pads 63, 64. The first side 61 of the substrate strip 6 is substantially the same as the first side 31 of the substrate strip 3. However, the second side 62 of the substrate strip 6 is different from the second side 32 of the substrate strip 3 according to the first embodiment of the invention. The second side 62 lacks second flanges and second recesses, and only has a plurality of second index holes 626, 627 for positioning.

Because the second side 62 of the substrate strip 6 lacks the second frame of the substrate strip 3, the area of the substrate strip can be further reduced and the substrate strip strips can be arrayed in a panel more densely. The first index holes 617, the second index holes 626, 627, the first frame 65 or the combinations thereof function as the second frame of the substrate strip 3 in the first embodiment, so that the effects of positioning and delivering cannot be influenced.

While an embodiment of the present invention has been illustrated and described, various modifications and improvements can be made by those skilled in the art. The embodiment of the present invention is therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A substrate strip comprising:
   a top and a bottom;
   a plurality of die pads disposed on the top of the substrate strip and a plurality of first frames alternating with the die pads;
   a first side comprising a plurality of first flanges and a plurality of first recesses, each of the first flanges comprising a mold gale and a first index hole, the mold gates extending from the first flanges to the die pads, each first index hole extending through the top and the bottom, each of the first recesses defined between two adjacent first flanges; and
   a second side which is opposite and substantially parallel to the first side including a plurality of second index boles, each of the second index holes extending through the top and the bottom, and a plurality of second flanges and a plurality of second recesses, the second flanges formed respectively opposite the first recesses of the first side and each of the second recesses defined between two adjacent second flanges, the second recesses formed respectively opposite the first flanges of the first side.

2. The substrate strip according to claim 1, wherein each of the second flanges is a second frame of the substrate strip.

3. A plurality of substrate strips arrayed in adjacently spaced relation to each other on a panel, each substrate strip comprising:
   a top and a bottom;
   a plurality of die pads disposed on the top of to substrate strip, and a plurality of first frames alternating with the die pads;
   a first side comprising a plurality of first flanges and a plurality of first recesses, each of the first flanges comprising a mold gate and a first index hole, the mold gates respectively extending from the first flanges to the die pads, each first index hole extending through the top and the bottom, each of the first recesses defined between two adjacent first flanges; and
   a second side which is opposite and substantially parallel to the first side including a plurality of second index holes, each of the second index holes extending through the top and the bottom, and a plurality of second flanges and a plurality of second recesses, the second flanges formed respectively opposite the first recesses of the first side and each of the second recesses defined between two adjacent second flanges, the second recesses fanned respectively opposite the first flanges of the first side;
   the substrate strips being arrayable in a configuration wherein the first flanges of one strip are respectively disposed in the second recesses of an adjacent strip and the second flanges of the one strip respectively disposed in the first recesses of an adjacent strip.

4. The plurality of substrate strips as claimed in claim 3 wherein each of the second flanges is a second frame of the substrate strip.

5. A method of arraying a plurality of adjacently spaced substrate strips on a panel so as to minimize the space occupied byte strips, each substrate strip having a plurality of die pads disposed on atop of the substrate strip and a plurality of first frames alternating wit the die pads, the method comprising:
   providing a plurality of substrate strips having a first side comprising a plurality of first flanges and a plurality of first recesses, each of the first flanges comprising a mold gate and a first index hole, each of the mold gates extending from each of the first flanges to each of the die pads, each of the first recesses defined between the two adjacent first flanges, and a second side which is opposite and substantially parallel to the first side including a plurality of second index holes and a plurality of second flanges end a plurality of second recesses, the second flanges formed in locations corresponding to those of the first recesses of the first side when the substrate strips are adjacently arrayed relative to each other, the second recesses defined between the second flanges and formed in locations corresponding to those of the first flanges of the first side when the substrate strips are adjacently arrayed relative to each other,
   arraying a first substrate strip on the panel;
   arraying a second substrate strip on the panel in substantial adjacently spaced relation to the first substrate strip wherein the first flanges of the second substrate strip are respectively arrayed in cooperatively receiving relation with the second recesses of the first substrate strip.

6. A plurality of substrate strips arrayed in adjacently spaced relation to each other on a panel, each substrate strip comprising:
   a first side comprising a plurality of flanges; and
   a second side which is apposite and substantially parallel to the first side and having a plurality of recesses respectively formed in locations corresponding to those of the flanges of the first side;
   wherein when the substrate strips are adjacently arrayed on a panel, the flanges are respectively cooperatively received by the recesses of an adjacent substrate strip in minimal spaced relation.

* * * * *